United States Patent [19]
Kuo et al.

[11] Patent Number: 5,623,263
[45] Date of Patent: Apr. 22, 1997

[54] 4TH-ORDER SIGMA-DELTA MODULATOR WITH LEAPFROG TOPOLOGY

[75] Inventors: Tai-Haur Kuo; Wen-Bin Lin; Chun-Hsien Su; Jhy-Rong Chen; Wen-Chyi Wang, all of Tainan, Taiwan

[73] Assignee: National Science Council, Taipei, Taiwan

[21] Appl. No.: 546,494

[22] Filed: Oct. 20, 1995

[51] Int. Cl.$^6$ .................................................. H03M 3/00
[52] U.S. Cl. ........................ 341/143; 341/155; 341/144
[58] Field of Search ...................................... 341/143, 144, 341/155; 375/26

[56] References Cited

U.S. PATENT DOCUMENTS

| | | |
|---|---|---|
| 4,551,683 | 11/1985 | Matsuo et al. ........................ 328/167 |
| 4,600,904 | 7/1986 | Shumaker ............................... 333/173 |
| 4,884,036 | 11/1989 | Koyama et al. ........................ 328/167 |
| 5,298,900 | 3/1994 | Mauthe et al. ........................... 341/143 |

*Primary Examiner*—Brian K. Young
*Attorney, Agent, or Firm*—Hitt Chwang & Gaines, P.C.

[57] ABSTRACT

The invention relates to a high performance and absolute stable 4th-order sigma-delta modulator with leapfrog topology which contains the following key components: (a) four integrators for integrating the difference signal between the input and reconstruct signal; (b) three add/subtract adders for adding or subtracting analog signal; (c) three loop coefficient control members for controlling the performance and stability of the modulator, (d) an analog-to-digital converter (A/D converter) for quantizing the output signals of the fourth integrator to digital codes, and (e) a digital-to-analog converter (D/A converter) for converting the digital codes to analog signals.

24 Claims, 5 Drawing Sheets

4TH-ORDER SIGMA-DELTA MODULATOR WITH LEAPFROG TOPOLOGY

FIELD OF THE INVENTION

The invention relates to a high performance and absolute stable 4th-order sigma-delta modulator with leapfrog topology, a method of stabilizing the 4th-order modulator and a method of obtaining the control coefficients of the modulator.

BACKGROUND OF THE INVENTION

The A/D converters are interfaces between analog signal domain and digital signal domain. Conventionally, the precise A/D converters need accurate analog process to achieve high resolution. Hence, the A/D converters with high precision can not easily implemented and realized in VLSI systems.

Recently, due to the development of oversampling and feedback control techniques applied on A/D conversion, the analog circuits of sigma-delta A/D converters which adopt simple and high tolerance components can avoid the drawbacks of conventional A/D converters. This new converter called sigma-delta A/D converter is composed of modulators and digital filters. When the order of the modulator is increased, the resolution of the whole system is increased and the nonlinear effects which always occur in the low order modulator such as limit cycle and pattern noise can be avoided in contrast, the high order modulators generally suffer from the unstable problem and the control coefficients of the modulators being too large or small, which causes the difficulty of implementing VLSI circuits. Hence, how to design a modulator of sigma-delta A/D converter, especially in high order architecture, is the most important challenge. K. C. Chao et al. in their article entitled "A High Order Topology for Interpolative Modulators for Oversampling A/D converters", IEEE Trans. on Circuits and Systems, vol. 37, Mar. 1990, disclose a topology called "Follow the Leader" for sigma-delta modulators, which is a very popular design methodology. However, this topology suffers from the complexity of system architecture and extreme of control coefficients when the topology is synthesized. This is the reason why this architecture is very difficult and costly for VLSI circuits realization. S. M. Moussavi et al. in their article entitled "High-Order Single-Stage Single-Bit Oversampling A/D Converter Stabilized with Local Feedback Loops", IEEE Trans. on Circuits and Systems II, vol. 41, Jan. 1994, disclose a different methodology design of system architecture in order to solve the stability problem which occurs when a sigma-delta modulator is implemented in a high-order form. However, the same problems such as complicated architecture, high cost, and difficult VLSI circuits realization occur.

U.S. Pat. No. 5,298,900 entitled "Sigma-Delta Modulator", invented by Manfred Mauthe and Rudolf Koch, discloses a cascaded sigma-delta modulator topology which is characterized by the combination of a second-order modulator and a first-order modulator to improve the problems of stability, noise and requirement of extra precise circuits in a third-order modulator. However, this topology has a disadvantage which is the requirement of matching components.

U.S. Pat. No. 5,061,928 entitled "System and Method of Scaling Error Signals of Caseload Second Order Modulators", invented by Teppo J. Karema, Tapani J. Ritoniemi and Aaine H. Tenhunen, discloses another cascaded sigma-delta modulator architecture which is characterized by the combination of adjoining two second-order modulators to avoid the realization of adjoining many high precision first order modulators and a requirement of special circuits in the first-order modulators. However, the disadvantage of the modulator disclosed in the aforesaid U.S. Pat. No. 5,298,900 still exists in this type modulator.

Therefore, a high-order (fourth-order) sigma-delta modulator with high resolution, absolute stable, insensitive to the matching of circuit components, low cost and easy implementation of VLSI circuits is still an urgent need in the art.

SUMMARY OF THE INVENTION

In order to overcome the drawbacks of prior art, a high performance 4th-order sigma-delta modulator with leapfrog topology is disclosed in the present invention which comprises: (a) four integrators for integrating the difference signal between the input and reconstruct signal; (b) three add/subtract adders for adding or subtracting analog signal; (c) three loop coefficient control members for controlling the performance and stability of the modulator, (d) an analog-to-digital converter (A/D converter) for quantizing the output signals of the fourth integrator to digital codes, and (e) a digital-to-analog converter (D/A converter) for converting the digital codes to an analog signal.

A sigma-delta modulator constructed according to a first preferred embodiment of the present invention comprises:

a first backward type integrator for integrating a first error signal and providing an output signal;

a second backward type integrator for integrating a second error signal and providing an output signal;

a third backward type integrator for integrating a third error signal and providing an output signal;

a first forward type integrator for integrating the output signal of the third backward type integrator and providing an output signal;

an A/D converter for quantizing the output signal of the first forward type integrator and providing digital output codes;

a D/A converter for converting the digital output codes of the A/D converter into a reference signal;

a first loop coefficient control member for weighting the output signal of the second backward type integrator by a first loop coefficient $f_2$;

a second loop coefficient control member for weighting the output signal of the third backward type integrator by a second loop coefficient $f_3$; and a third loop coefficient control member for weighting the output signal of the first forward type integrator by a third loop coefficient $f_4$; wherein the first error signal is obtained by subtracting the reference signal converted by said D/A converter and the output signal of the second backward type integrator which is weighted by the first loop coefficient $f_2$ from an input signal, the second error signal is obtained by subtracting the output signal of the third backward type integrator which is weighted by the second loop coefficient $f_3$ from the output signal of the first backward type integrator, and the third error signal is obtained by subtracting the output signal of the first forward type integrator which is weighted by the third loop coefficient $f_4$ from the output signal of the second backward type integrator.

A sigma-delta modulator constructed according to a second preferred embodiment of the present invention comprises:

a first gain coefficient control member for weighting a first error signal by a first gain coefficient $k_1$;

a first backward type integrator for integrating said first error signal which is weighted by the first gain coefficient $k_1$ and providing an output signal;

a second gain coefficient control member for weighting a second error signal by a second gain coefficient $k_2$;

a second backward type integrator for integrating said second error signal which is weighted by the second gain coefficient $k_2$ and providing an output signal;

a third gain coefficient control member for weighting a third error signal by a third gain coefficient $k_3$;

a third backward type integrator for integrating said third error signal which is weighted by the third gain coefficient $k_3$ and providing an output signal;

a fourth gain coefficient control member for weighting the output signal of the third backward integrator by a fourth gain coefficient $k_4$;

a first forward type integrator for integrating the output signal of the third backward integrator which is weighted by the fourth gain coefficient $k_4$ and providing an output signal;

an A/D converter for quantizing the output signal of the first forward type integrator and providing digital output codes;

a D/A converter for converting the digital output codes of the A/D converter into a reference signal;

a first loop coefficient control member for weighting the output signal of the second backward type integrator by a first loop coefficient $f_2$;

a second loop coefficient control member for weighting the output signal of the third backward type integrator by a second loop coefficient $f_3$; and a third loop coefficient control member for weighting the output signal of the first forward type integrator by a third loop coefficient $f_4$; wherein the first error signal is obtained by subtracting the reference signal converted by said D/A converter and the output signal of the second backward type integrator which is weighted by the first loop coefficient $f_2$ from an input signal, the second error signal is obtained by subtracting the output signal of the third backward type integrator which is weighted by the second loop coefficient $f_3$ from the output signal of the first backward type integrator, and the third error signal is obtained by subtracting the output signal of the first forward type integrator which is weighted by the third loop coefficient $f_4$ from the output signal of the second backward type integrator.

A sigma-delta modulator constructed according to a third preferred embodiment of the present invention comprises:

a filter which receives an error signal and providing an output signal;

an A/D converter for quantizing the output signal of the filter and providing digital output codes; and a D/A converter for converting the digital output codes of the A/D converter into a reference signal; wherein the error signal is a difference between an input signal and the reference signal converted by said D/A converter, said filter comprises:

a first gain coefficient control member for weighting a first signal by a first gain coefficient $k_1$;

a first backward type integrator for integrating said first signal which is weighted by the first gain coefficient $k_1$ and providing an output signal;

a second gain coefficient control member for weighting a second signal by a second gain coefficient $k_2$;

a second backward type integrator for integrating said second signal which is weighted by the second gain coefficient $k_2$ and providing an output signal;

a third gain coefficient control member for weighting a third signal by a third gain coefficient $k_3$;

a third backward type integrator for integrating said third signal which is weighted by the third gain coefficient $k_3$ and providing an output signal;

a fourth gain coefficient control member for weighting the output signal of the third backward integrator by a fourth gain coefficient $k_4$;

a first forward type integrator for integrating the output signal of the third backward integrator which is weighted by the fourth gain coefficient $k_4$ and providing an output signal which is said output signal provided by said filter;

a first loop coefficient control member for weighting the output signal of the second backward type integrator by a first loop coefficient $f_2$;

a second loop coefficient control member for weighting the output signal of the third backward type integrator by a second loop coefficient $f_3$; and a third loop coefficient control member for weighting the output signal of the first forward type integrator by a third loop coefficient $f_4$; wherein the first signal is obtained by subtracting the output signal of the second backward type integrator which is weighted by the first loop coefficient $f_2$ from the error signal, the second signal is obtained by subtracting the output signal of the third backward type integrator which is weighted by the second loop coefficient $f_3$ from the output signal of the first backward type integrator, and the third signal is obtained by subtracting the output signal of the first forward type integrator which is weighted by the third loop coefficient $f_4$ from the output signal of the second backward type integrator.

A sigma-delta modulator constructed according to a fourth preferred embodiment of the present invention comprises:

a filter;

an A/D converter for quantizing an output signal provided by the filter and providing digital output codes; and a D/A converter for converting the digital output codes of the A/D converter into a reference signal; wherein said filter comprises a first backward type integrator for integrating a first error signal and providing an output signal;

a second backward type integrator for integrating a second error signal and providing an output signal;

a third backward type integrator for integrating a third error signal and providing an output signal;

a first forward type integrator for integrating the output signal of the third backward integrator and providing said output signal which is quantized by said A/D converter;

a first loop coefficient control member for weighting the output signal of the second backward type integrator by a first loop coefficient $f_2$;

a second loop coefficient control member for weighting the output signal of the third backward type integrator by a second loop coefficient $f_3$; and a third loop coefficient control member for weighting the output signal of the first forward type integrator by a third loop coefficient $f_4$; wherein the first error signal is obtained by subtracting the reference signal converted by said D/A converter and the output signal of the second backward type integrator which is weighted by the first loop coefficient $f_2$ from an input signal, the second error signal is obtained by subtracting the output signal of the third backward type integrator which is weighted by the second loop coefficient $f_3$ from the output signal of the first backward type integrator, and the third error signal is obtained by subtracting the output signal of the first forward type integrator which is weighted by the third loop coefficient $f_4$ from the output signal of the second backward type integrator.

The 4th-order sigma-delta modulator with leapfrog topology of the invention has the following advantages. First, the 4th-order modulator has very simple and easy architecture so that a small chip area and low cost are required when it is implemented in VLSI circuits. Next, the values of control coefficients are very close to one, which are advantageous for VLSI circuits implementation. Thirdly, the 4th-order modulator in general has a very low sensitivity to the variation of circuit components and thus a very good stability, Hence, the errors due to the quality of circuit implementation and aging do not influence the performance and stability of the modulator severely. Fourthly, a lower noise level and noise quantity in the baseband resulting from the adoption of oversampling and negative feedback control techniques render the present 4th-order modulator high resolution.

BRIEF DESCRIPTION OF THE DRAWINGS

The foregoing and other objects, aspects and advantages will be better understood from the following detailed description of the preferred embodiments of the invention with reference to the accompanying drawings wherein like numerals represent like elements and in which.

DETAILED DESCRIPTION OF THE PREFERRED EMBODIMENTS

Figure 1:
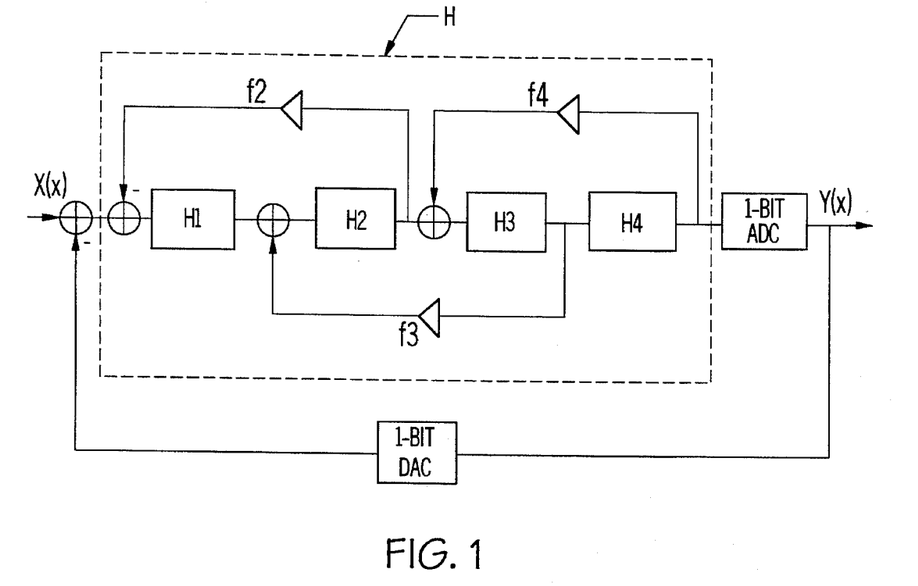
FIG. 1 shows a basic block diagram of the 4th-order sigma-delta modulator with leapfrog topology of the invention.
Figure 2:
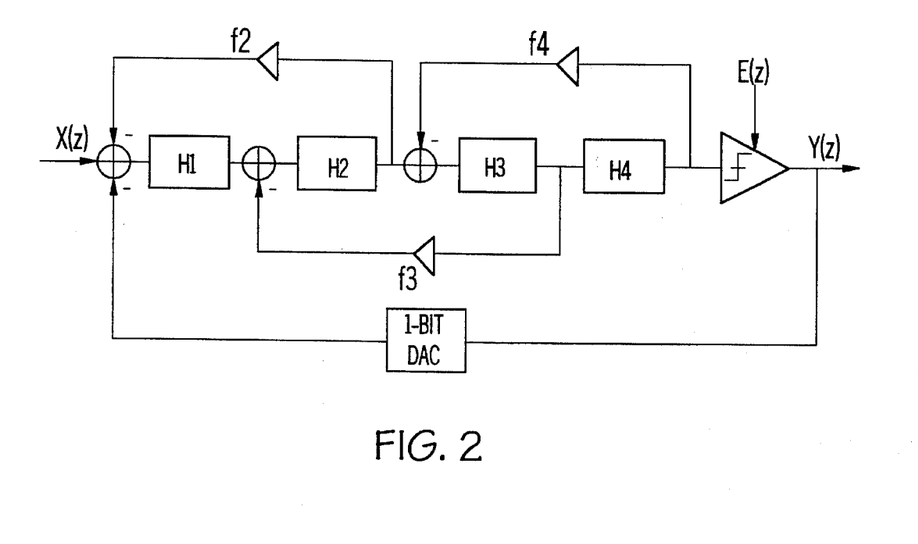
FIG. 2 shows a linear model of FIG. 1.

FIG. 1 shows the basic block diagram of the 4th-order sigma-delta modulator with leapfrog topology of the invention. The topology comprises four integrators, $H_i(z)$ (i=1, 2, 3, 4), which constitute the filter of leapfrog architecture denoted by H, an 1-bit A/D converter (ADC), an 1-bit D/A converter (DAC), and three loop coefficients, $f_2, f_3, f_4$. When the linear model is adopted to analyze the leapfrog topology of FIG. 1, the result is shown in FIG. 2. According to FIG. 2, the transfer function of this topology is depicted as follows:

$$Y(z)=SFT * X(z)+NTF * E(z) \quad (1)$$

wherein SFT denotes the Signal Transfer Function which is depicted as follows $$\frac{Y(z)}{X(z)} = \frac{\prod_{i=1}^{4} H_i}{1 + \left(\sum_{i=2}^{4} f_i H_i \cdots_i H_i\right) + (1+f_2 f_4)\prod_{i=1}^{4} H_i} \quad (2)$$

NTF denotes the Noise Transfer Function which is depicted as follows:

$$\frac{N(z)}{X(z)} = \frac{1 + \left(\sum_{i=2}^{4} f_i H_i \cdots_i H_i\right) + f_2 f_4 \prod_{i=1}^{4} H_i}{1 + \left(\sum_{i=2}^{4} f_i H_i \cdots_i H_i\right) + (1+f_2 f_4)\prod_{i=1}^{4} H_i} \quad (3)$$

Figure 3:
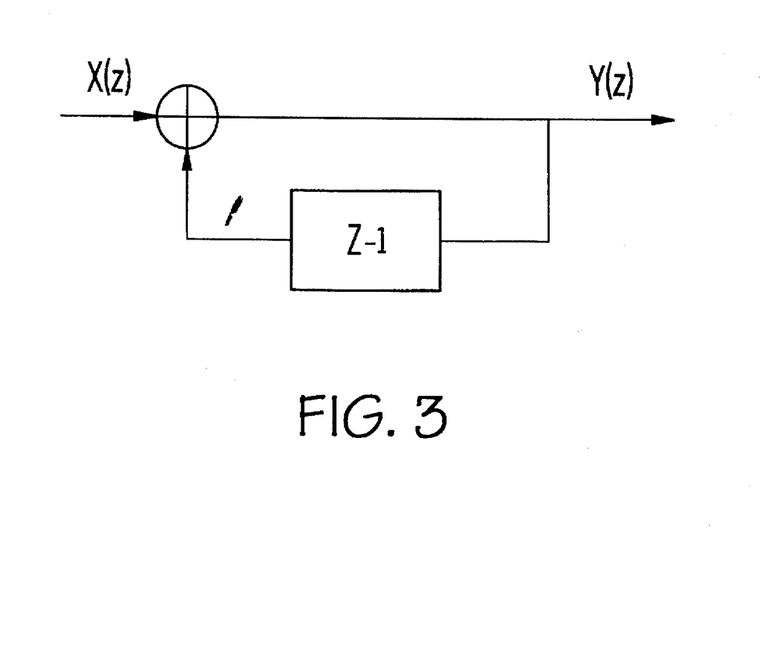
FIG. 3 illustrates a backward type integrator.
Figure 4:
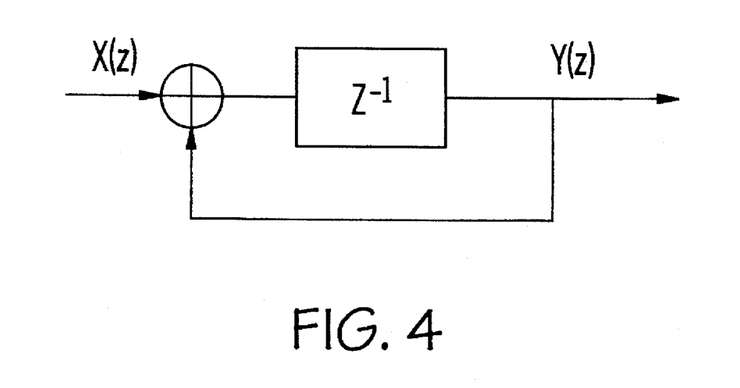
FIG. 4 illustrates a forward type integrator.
Figure 5:
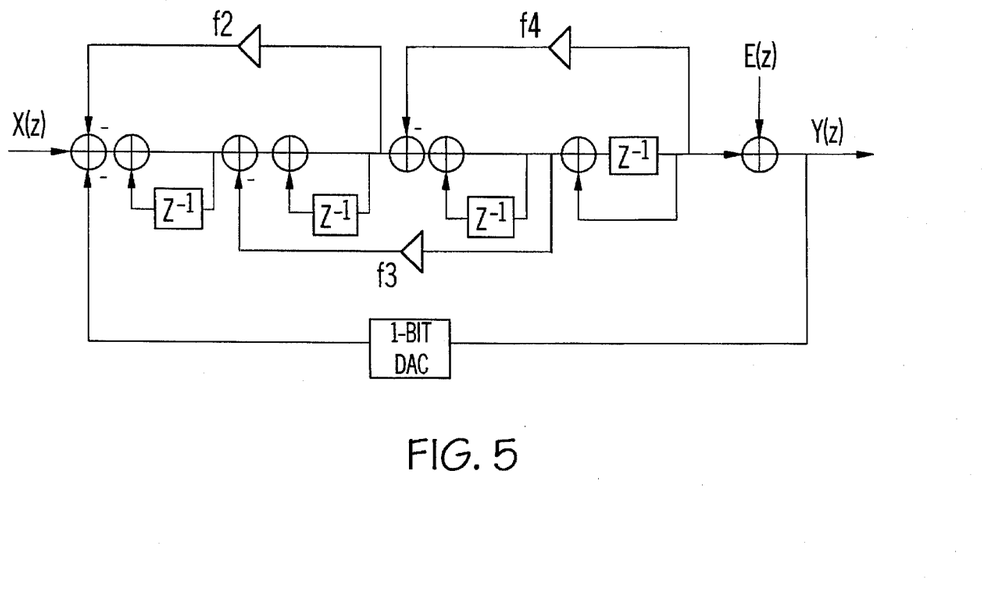
FIG. 5 illustrates a block diagram of a 4th-order sigma-delta modulator with leapfrog topology constructed according to a preferred embodiment of the invention.

A preferred embodiment of the 4th-order sigma-delta modulator with leapfrog topology of the invention is shown in FIG. 5. The topology comprises four integrators, $H_i(z)$ (i=1, 2, 3, 4), an 1-bit quantizater, an 1-bit D/A converter, and 3 loop coefficients, $f_2, f_3, f_4$. The transfer function of the backward type integrators $H_1, H_2, H_3$ and the forward type integrator $H_4$ which are shown in FIG. 3 and 4 respectively are described as follows:

$$H(z) = \frac{Z^{-1}}{1-Z^{-1}} = \frac{1}{z-1} \quad \text{(backward)} \quad (4)$$

$$H(z) = \frac{1}{1-Z^{-1}} = \frac{z}{z-1} \quad \text{(forward)} \quad (5)$$

Substituting Eqs. (4) and (5) into Eq. (1), the transfer function of this modulator becomes as follows $$Y(z) = \frac{N_X(z)}{D(z)} X(z) + \frac{N_E(Z)}{D(z)} E(z) \quad (6)$$

wherein $$D(z)=(1+f_2+f_3)z^4+(-3-2f_2-2f_3+f_4f_2f_4)z^3+(6+f_2+f_3-2f_4)z^2+(-4+f_4)z+1$$

$$N_X(z)=z^3, \text{ and}$$

$$N_E(z)=D(z)-N_X(z)$$

Considering the transformation between Z domain and S domain, the following relation can be obtained, $z=e^{st}=e^{j\omega t}$, where $\omega$ is the angular frequency, $t=1/f_s$, $f_s$ is the sampling frequency. In oversampling technique, the frequency of an input signal is much smaller than sampling frequency. Thus, $\omega t$ approaches zero, z approaches one. Substituting z=1 into Eq. (6), the transfer function becomes as follows:

$$Y(z) = \frac{1}{1+f_2 f_4} X(z) + \frac{f_2 f_4}{1+f_2 f_4} E(z) \quad (7)$$

The signal-to-noise ratio (SNR) can be approached as follows:

$$\frac{\frac{1}{1+f_2 f_4} X(z)}{\frac{f_2 f_4}{1+f_2 f_4} E(z)} = \frac{1}{f_2 f_4} \frac{X(z)}{E(z)} \quad (8)$$

If we want to obtain the maximal SNR, the product of loop coefficients, $f_2 f_4$, must approach zero.

In VLSI circuits, the values of loop coefficients are realized by the ratio of capacitance values. Hence, the values of loop coefficients can't be too large or small. According to the theories of Z domain, All the values of poles of transfer function must be less than one, i.e., $|Z_{pi}|<1$, otherwise the modulator is unstable. Combining the above conditions, an algorithm which can make the modulator stable is developed and used to obtain the values of loop coefficients, $f_2$, $f_3$, $f_4$.

Due to the consideration of VLSI circuits implementation, the reasonable values of coefficients are limited in a range, for example (–10, 10). Changing the value of each coefficient by 0.1 each time in the limited range, the corresponding roots can be easily obtained from the denominator of transfer function. Recording the corresponding coefficients, $f_2$, $f_3$, $f_4$ when the absolute values of those roots are less than one. Repeating the above method, the coefficients which make the modulator of the invention stable are obtained.

According to the results of the above analysis and the modulator architecture of the invention, the best selection of the coefficient $f_2$ is set to equal zero ($f_2=0$). Besides the advantage of topology simplification, the other advantages such as absolute stability, low cost and negligible degradation in system SNR can be obtained evidently. Substituting $f_2=0$ into Eq. (6), the transfer function is converted to the following form, $$Y(z) = \frac{N_X(z)}{D_d(z)} X(z) + \frac{N_{EE}(Z)}{D_d(z)} E(z) \qquad (9)$$

wherein
$D_d(z)=(1+f_3)z^4+(-3-2f_3+f_4)z^3+(6+f_3-2f_4)z^2+(-4+f_4)z+1$, $N_X(z)=z^3$, and $N_{EE}(z)=D_d(z)-N_X(z)$. Since the roots of $D_d(z)$ are required to less than one, the relationship, $$\frac{1}{1+f_3} < 1,$$

must hold. Hence, $f_3 \neq 0$ is obtained.

Figure 6:
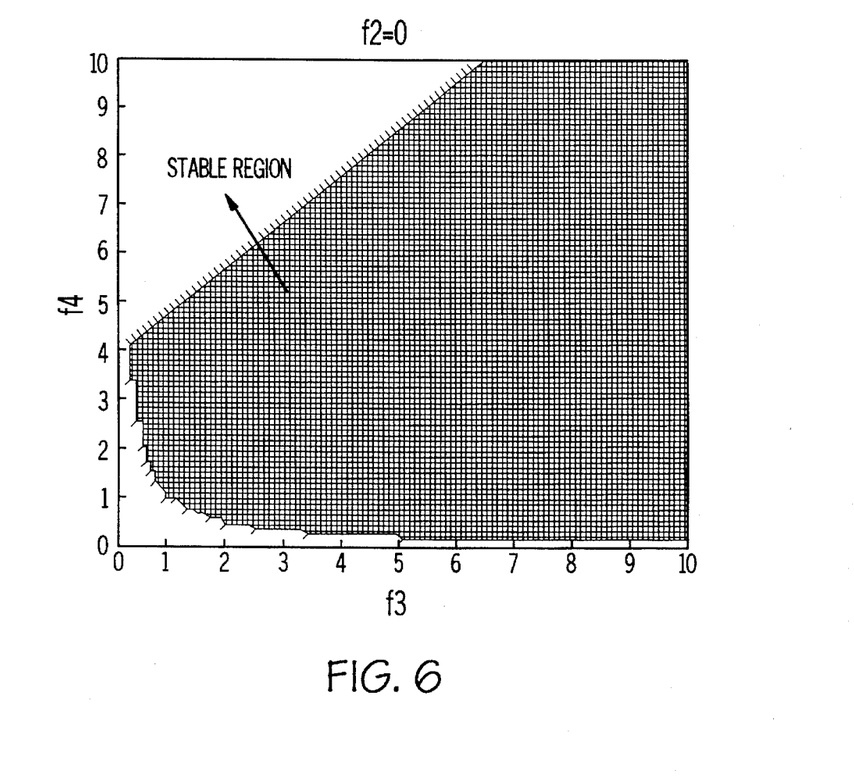
FIG. 6 depicts the stable region of the 4th-order sigma-delta modulator with leapfrog topology shown in FIG. 5.

From the above discussion, we can conclude the following results :(i) $f_2=0$, (ii) $0<f_3<10$, (iii) $f_4$ in (–10, 10) range. A numerical algorithm can be proposed to analyze this modulator. The result is shown in FIG. 6. There are many groups of coefficients for selection. The best selection for VLSI circuits implementation is to choose the coefficient values which approach one, e.g. $(f_2, f_3, f_4)=(0, 2.5, 3.6)$.

Figure 7:
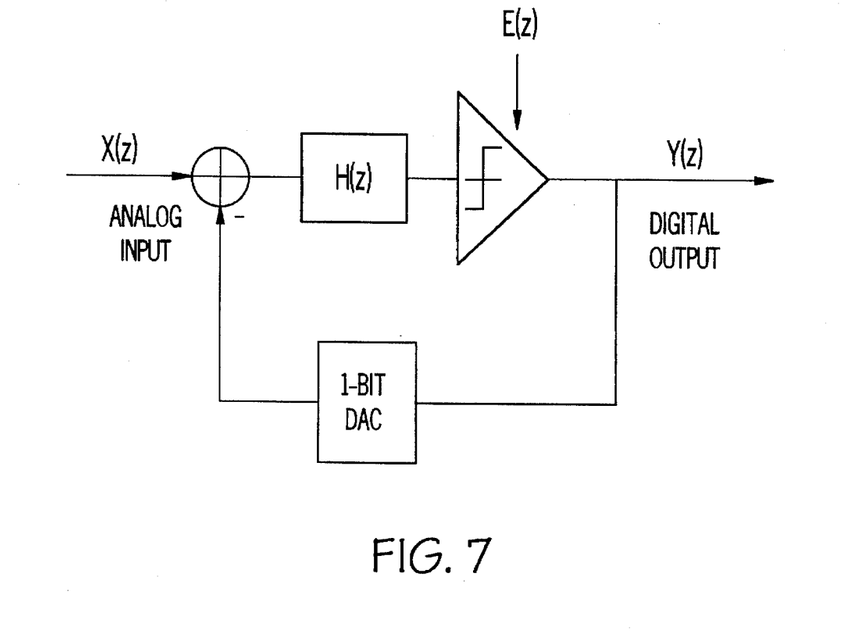
FIG. 7 shows a simplified block diagram of the 4th-order sigma-delta modulator with leapfrog topology shown in FIG. 1 or FIG. 5.
Figure 8:
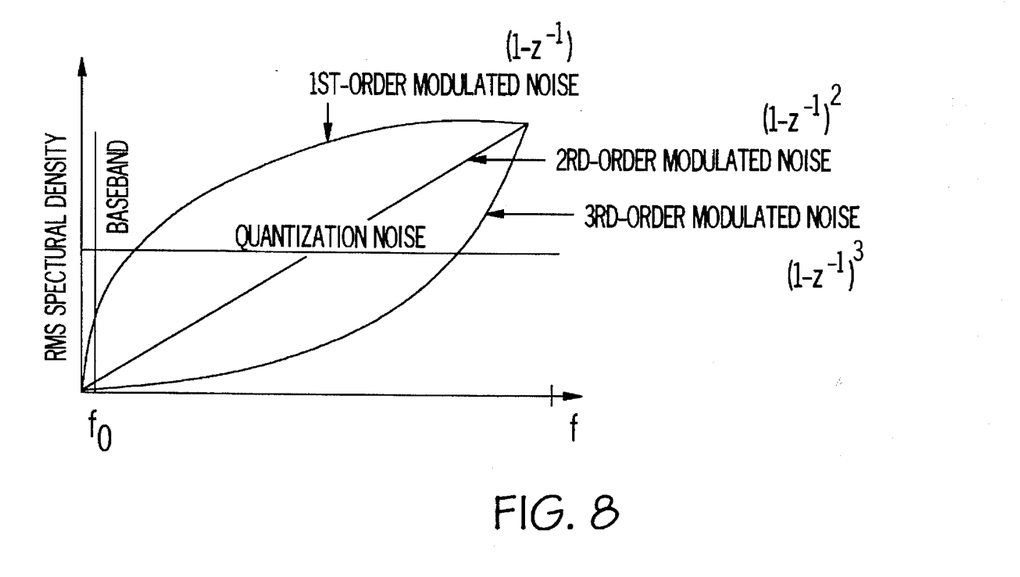
FIG. 8 is a plot which shows the comparison of power spectral density of, quantization noise and of modulated noise of sigma-delta modulators having various order of integrators.

The structure of the present modulator may be represented by the block diagram depicted in FIG. 7, too. The operation of the modulator shown in FIG. 7 is described as follows. An error signal is generated by subtracting the output signal of D/A converter from an input signal, The error signal passes through the filter of leapfrog topology (H block shown in FIG. 7). The output signal of the filter then passes through an A/D converter for quantization and encoding. Finally, the modulator generates the digital codes for processing. Owing to the use of oversampling and feedback control techniques, the noise level is lower than the Nyquist rate's, and the noise power in the base band is shaped to high frequency band (called noise-shaping). The corresponding noise is even lower in the base band as shown in FIG. 8. For further details, one can refer to an article entitled "Oversampling Methods for A/D and D/A Converter", edited by James C. Candy, and Gabor C. Temes, in *IEEE Press, Oversampling Delta-Sigma Data Converters Theory, Design, and Simulation, N.Y.*, 1991.

According to FIG. 7, the transfer function of modulator is described as follows:

$$Y = \frac{H}{1+H} X + \frac{1}{1+H} E = SFT*X + NFT*E$$

wherein Y denotes the output signal, H denotes the leapfrog topology topology filter is denoted as $S_x$ filter, E denotes the quantization noise. The sensitivity of leapfrog topology filter is denoted as $S_x^H$. The sensitivity of the modulator of the invention can be depicted as follows:

$$S_X^P = S_H^P \cdot S_X^H$$

wherein X denotes the circuit's components, P denotes STF or NTF. Hence, $S_H^P$ is $S_H^{SFT}$ or $S_H^{NTF}$. According to the definition, $$S_y^x = \frac{\partial x}{x} / \frac{\partial y}{y} = \frac{y}{x} \cdot \frac{\partial x}{\partial y},$$

the following results can be derived $$S_H^{SFT} = \frac{H}{STF} \cdot \frac{\partial STF}{\partial H} = \frac{1}{1+H} \qquad (10)$$

$$S_H^{NFT} = \frac{H}{NTF} \cdot \frac{\partial NTF}{\partial H} = \frac{-H}{1+H} \qquad (11)$$

Since H denotes a low pass filter, the values of H are very large in low frequency and very small in high frequency. Hence, the following relationship can be obtained:

$$0<S_H^{SFT}<1 \text{ and } -1<S_H^{NTF}<0$$

According to the teaching of a textbook entitled "Design of Analog Filter", by R. Schanmann and M. S. Ghansi, Prentice Hall, 1990, the sensitivity of $S_X^H$ is the lowest in all filter topology. Hence, the important result, $|S_X^P| \leq |S_X^H|$, is obtained. The 4th-order sigma-delta modulator with leapfrog topology has a lower sensitivity to circuit's components than leapfrog type filter's. Even if the error is generated due to circuit's aging and implementation, the performance and stability of the modulator are not influenced severely. Besides the advantage of lower sensitivity, the noise level and power are lower in base band due to oversampling and feedback control techniques. Thus, the modulator of the invention is characterized by high resolution.

Figure 9:
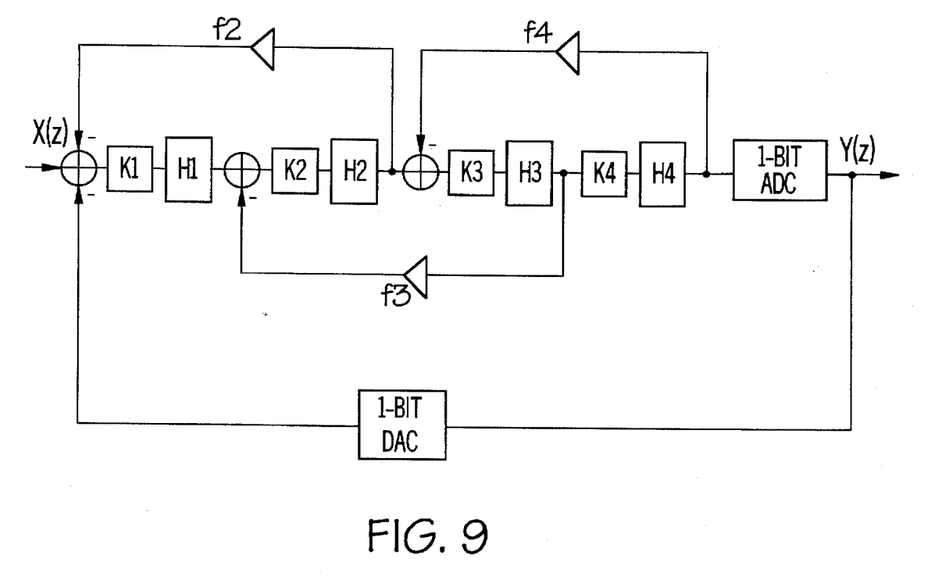
FIG. 9 shows a block diagram of a 4th-order sigma-delta modulator with leapfrog topology constructed according to another preferred embodiment of the invention.

FIG. 9 shows another preferred embodiment of 4th-order sigma-delta modulator with leapfrog topology of the invention. The components contained in this modulator are: (a) four integrators for integrating the difference signal between the input and reconstruct signals, (b) three add/subtract adders for adding or subtracting analog signal, (c) seven control coefficient members for controlling the performance and stability of the modulator, (d) an A/D converter for quantizing the output signals of the fourth integrator to digital codes, and (e) a D/A converter for converting the digital codes to analog signal. The first three integrators, $H_1$, $H_2$, $H_3$, are backward Euler type integrators whose transfer function is $1/(1-z^{-1})$. The fourth integrator, $H_4$, is a forward Euler type integrator whose transfer function is $z^{-1}/(1-z^{-1})$. The control coefficients of the seven control coefficient members are $f_2$, $f_3$, $f_4$, $k_1$, $k_2$, $k_3$ and $k_4$, wherein $f_2$, $f_3$ and $f_4$ are loop coefficients and $k_1$, $k_2$, $k_3$ and $k_4$ are integrator gain coefficients. The values of these coefficients can be obtained by the same way as in FIG. 6. The preferred values are listed as follows: $f_2=0$; $f_3=5/3$; $f_4=8/5$; $k_1=2/3$; $k_2=2/3$; $k_3=9/4$; $k_4=1$.

The output of the fourth integrator is fed to the 1-bit A/D converter. The output of the 1-bit A/D converter is fed to the 1-bit D/A converter. An error signal which is generated by subtracting the output signal of the 1-bit D/A converter from an input signal passes through a leapfrog topology filter as the H block shown in FIG. 7 and the output signal of the leapfrog topology filter is fed into the 1-bit A/D converter for quantization and encoding.

While the invention has been described in terms of several preferred embodiments, those skilled in the art will recognize that the invention can be practiced with modification within the spirit and scope of the appended claims.

We claim:

1. A sigma-delta modulator comprising:

a first backward type integrator for integrating a first error signal and providing an output signal;

a second backward type integrator for integrating a second error signal and providing an output signal;

a third backward type integrator for integrating a third error signal and providing an output signal;

a first forward type integrator for integrating the output signal of the third backward type integrator and providing an output signal;

an A/D converter for quantizing the output signal of the first forward type integrator and providing digital output codes;

a D/A converter for converting the digital output codes of the A/D converter into a reference signal;

a first loop coefficient control member for weighting the output signal of the second backward type integrator by a first loop coefficient $f_2$;

a second loop coefficient control member for weighting the output signal of the third backward type integrator by a second loop coefficient $f_3$; and a third loop coefficient control member for weighting the output signal of the first forward type integrator by a third loop coefficient $f_4$;

wherein the first error signal is obtained by subtracting the reference signal converted by said D/A converter and the output signal of the second backward type integrator which is weighted by the first loop coefficient $f_2$ from an input signal, the second error signal is obtained by subtracting the output signal of the third backward type integrator which is weighted by the second loop coefficient $f_3$ from the output signal of the first backward type integrator, and the third error signal is obtained by subtracting the output signal of the first forward type integrator which is weighted by the third loop coefficient $f_4$ from the output signal of the second backward type integrator.

2. The modulator according to claim 1, wherein the value of the first loop coefficient $f_2$ is zero.

3. The modulator according to claim 2, wherein the values of the second and third loop coefficients $f_3$ and $f_4$ are 2.5 and 3.6, respectively.

4. The modulator according to claim 1, wherein the A/D converter is an 1-bit A/D converter.

5. The modulator according to claim 1, wherein the D/A converter is an 1-bit D/A converter.

6. A sigma-delta modulator comprising:

a first gain coefficient control member for weighting a first error signal by a first gain coefficient $k_1$;

a first backward type integrator for integrating said first error signal which is weighted by the first gain coefficient $k_1$ and providing an output signal;

a second gain coefficient control member for weighting a second error signal by a second gain coefficient $k_2$;

a second backward type integrator for integrating said second error signal which is weighted by the second gain coefficient $k_2$ and providing an output signal;

a third gain coefficient control member for weighting a third error signal by a third gain coefficient $k_3$;

a third backward type integrator for integrating said third error signal which is weighted by the third gain coefficient $k_3$ and providing an output signal;

a fourth gain coefficient control member for weighting the output signal of the third backward integrator by a fourth gain coefficient $k_4$;

a first forward type integrator for integrating the output signal of the third backward integrator which is weighted by the fourth gain coefficient $k_4$ providing an output signal;

an A/D converter for quantizing the output signal of the first forward type integrator and providing digital output codes;

a D/A converter for converting the digital output codes of the A/D converter into a reference signal;

a first loop coefficient control member for weighting the output signal of the second backward type integrator by a first loop coefficient $f_2$;

a second loop coefficient control member for weighting the output signal of the third backward type integrator by a second loop coefficient $f_3$; and a third loop coefficient control member for weighting the output signal of the first forward type integrator by a third loop coefficient $f_4$; wherein the first error signal is obtained by subtracting the reference signal converted by said D/A converter and the output signal of the second backward type integrator which is weighted by the first loop coefficient $f_2$ from an input signal, the second error signal is obtained by subtracting the output signal of the third backward type integrator which is weighted by the second loop coefficient $f_3$ from the output signal of the first backward type integrator, and the third error signal is obtained by subtracting the output signal of the first forward type integrator which is weighted by the third loop coefficient $f_4$ from the output signal of the second backward type integrator.

7. The modulator according to claim 6, wherein the values of the first, second, third and fourth gain coefficients $k_1$, $k_2$, $k_3$ and $k_4$, are all equal to 1.

8. The modulator according to claim 7, wherein the value of first loop coefficient $f_2$ is 0.

9. The modulator according to claim 8, wherein the values of the second and third loop coefficients $f_3$ and $f_4$ are 2.5 and 3.6, respectively.

10. The modulator according to claim 6, wherein the values of the first, second, third and fourth gain coefficients $k_1$, $k_2$, $k_3$ and $k_4$ are 2/3, 2/3, 9/4, 1, respectively, and the first, second and third loop coefficients $f_2$, $f_3$ and $f_4$ are 0, 5/3 and 8/5, respectively.

11. The modulator according to claim 6, wherein the A/D converter is an 1-bit A/D converter.

12. The modulator according to claim 6, wherein the D/A converter is an 1-bit D/A converter.

13. A sigma-delta modulator comprising:

a filter which receives an error signal and providing an output signal;

an A/D converter for quantizing the output signal of the filter and providing digital output codes; and a D/A converter for converting the digital output codes of the A/D converter into a reference signal;

wherein the error signal is a difference between an input signal and the reference signal converted by said D/A converter, said filter comprises:

a first gain coefficient control member for weighting a first signal by a first gain coefficient $k_1$;

a first backward type integrator for integrating said first signal which is weighted by the first gain coefficient $k_1$ and providing an output signal;

a second gain coefficient control member for weighting a second signal by a second gain coefficient $k_2$;

a second backward type integrator for integrating said second signal which is weighted by the second gain coefficient $k_2$ and providing an output signal;

a third gain coefficient control member for weighting a third signal by a third gain coefficient $k_3$;

a third backward type integrator for integrating said third signal which is weighted by the third gain coefficient $k_3$ and providing an output signal;

a fourth gain coefficient control member for weighting the output signal of the third backward integrator by a fourth gain coefficient $k_4$;

a first forward type integrator for integrating the output signal of the third backward integrator which is weighted by the fourth gain coefficient $k_4$ and providing an output signal which is said output signal provided by said filter;

a first loop coefficient control member for weighting the output signal of the second backward type integrator by a first loop coefficient $f_2$;

a second loop coefficient control member for weighting the output signal of the third backward type integrator by a second loop coefficient $f_3$; and a third loop coefficient control member for weighting the output signal of the first forward type integrator by a third loop coefficient $f_4$;

wherein the first signal is obtained by subtracting the output signal of the second backward type integrator which is weighted by the first loop coefficient $f_2$ from the error signal, the second signal is obtained by subtracting the output signal of the third backward type integrator which is weighted by the second loop coefficient $f_3$ from the output signal of the first backward type integrator, and the third signal is obtained by subtracting the output signal of the first forward type integrator which is weighted by the third loop coefficient $f_4$ from the output signal of the second backward type integrator.

14. The modulator according to claim 13, wherein the values of the first, second, third and fourth gain coefficients $k_1$, $k_2$, $k_3$ and $k_4$, are all equal to 1.

15. The modulator according to claim 14, wherein the value of the first loop coefficient $f_2$ is 0.

16. The modulator according to claim 15, wherein the values of the second and third loop coefficients $f_3$ and $f_4$ are 2.5 and 3.6, respectively.

17. The modulator according to claim 13, wherein the values of the first, second, third and fourth gain coefficients $k_1$, $k_2$, $k_3$ and $k_4$ are 2/3, 2/3, 9/4, 1, respectively, and the first, second and third loop coefficients $f_2$, $f_3$ and $f_4$ are 0, 5/3 and 8/5, respectively.

18. The modulator according to claim 13, wherein the A/D converter is an 1-bit A/D converter.

19. The modulator according to claim 13, wherein the D/A converter is an 1-bit D/A converter.

20. A sigma-delta modulator comprising:

a filter;

an A/D converter for quantizing an output signal provided by the filter and providing digital output codes; and a D/A converter for converting the digital output codes of the A/D converter into a reference signal;

wherein said filter comprises:

a first backward type integrator for integrating a first error signal and providing an output signal;

a second backward type integrator for integrating a second error signal and providing an output signal;

a third backward type integrator for integrating a third error signal and providing an output signal;

a first forward type integrator for integrating the output signal of the third backward integrator and providing said output signal which is quantized by said A/D converter;

a first loop coefficient control member for weighting the output signal of the second backward type integrator by a first loop coefficient $f_2$;

a second loop coefficient control member for weighting the output signal of the third backward type integrator by a second loop coefficient $f_3$; and a third loop coefficient control member for weighting the output signal of the first forward type integrator by a third loop coefficient $f_4$;

wherein the first error signal is obtained by subtracting the reference signal converted by said D/A converter and the output signal of the second backward type integrator which is weighted by the first loop coefficient $f_2$ from an input signal, the second error signal is obtained by subtracting the output signal of the third backward type integrator which is weighted by the second loop coefficient $f_3$ from the output signal of the first backward type integrator, and the third error signal is obtained by subtracting the output signal of the first forward type integrator which is weighted by the third loop coefficient $f_4$ from the output signal of the second backward type integrator.

21. The modulator according to claim 20, wherein the value of the first loop coefficient $f_2$ is 0.

22. The modulator according to claim 21, wherein the values of the second and third loop coefficients $f_3$ and $f_4$ are 2.5 and 3.6, respectively.

23. The modulator according to claim 20, wherein the A/D converter is an 1-bit ND converter.

24. The modulator according to claim 20, wherein the D/A converter is an 1-bit D/A converter.

* * * * *

UNITED STATES PATENT AND TRADEMARK OFFICE
CERTIFICATE OF CORRECTION

PATENT NO. : 5,623,263
DATED : April 22, 1997
INVENTOR(S) : Kuo et al.

It is certified that error appears in the above-indentified patent and that said Letters Patent is hereby corrected as shown below:

Col. 6, line 42, delete "$D(z)=(1+f_2+f_3)z^4+(-3-2f_2-2f_3+f_4f_2f_4)z^3+(6+f_2+f_3-2f_4)z^2+(-4+f_4)z+1$" and insert therefor -- $D(z)=(1+f_2+f_3)z^4+(-3-2f_2-2f_3+f_4t_2f_4)z^3+(6+f_2+f_3-2f_4)z^2+(-4+f_4)z+1$ --.

Col. 7, line 67, delete "topology", second occurrence.

Col. 7, line 67, delete "is denoted as $S_x$ filter".

Col. 8, line 53, delete "$z^{31-1}$" and insert therefor -- $z^{1-1}$ --.

Signed and Sealed this

Sixteenth Day of September, 1997

Attest:

BRUCE LEHMAN

*Attesting Officer*  *Commissioner of Patents and Trademarks*